United States Patent [19]

Hamilton

[11] Patent Number: 4,796,299
[45] Date of Patent: Jan. 3, 1989

[54] VIDEO ENCODER APPARATUS

[75] Inventor: Jeffrey S. Hamilton, Oxford, Conn.

[73] Assignee: ITT Corporation, New York, N.Y.

[21] Appl. No.: 768,426

[22] Filed: Aug. 22, 1985

[51] Int. Cl.[4] .............................................. H04N 7/167
[52] U.S. Cl. ......................................... 380/14; 380/11; 380/20
[58] Field of Search ........................ 358/119, 114, 123; 380/10, 11, 14, 20

[56] References Cited

U.S. PATENT DOCUMENTS

| 4,405,942 | 9/1983 | Block et al. | 358/119 |
| 4,547,802 | 10/1985 | Fogarty et al. | 358/119 |
| 4,563,702 | 1/1986 | Heller et al. | 358/119 |
| 4,620,224 | 10/1986 | Lee et al. | 380/14 |
| 4,642,688 | 2/1987 | Lowry et al. | 380/11 |
| 4,691,352 | 9/1987 | Arragon et al. | 380/14 |

FOREIGN PATENT DOCUMENTS 8400106  3/1984  United Kingdom ................. 358/119

Primary Examiner—Stephen C. Buczinski
Assistant Examiner—Linda J. Wallace
Attorney, Agent, or Firm—T. L. Peterson

[57] ABSTRACT

A line rotation encoder for use with cable or pay television systems includes a storage unit having a storage capacity large enough to store only a single digitized video horizontal line of information, an address counter coupled to the storage unit and split-address circuitry for setting the address counter to an initial value. A comparator unit coupled to the address counter provides an end of line signal. As each encoded video sample is read out from a storage location addressed by the address counter, a digitized sample for a subsequent horizontal video line overwrites the value previously read out. When the encoded line has been completely read out, the next line is already stored in the storage unit.

11 Claims, 2 Drawing Sheets

VIDEO ENCODER APPARATUS

BACKGROUND OF THE INVENTION

The invention pertains to encoding systems usable with video signals.

In pay or cable television systems, some form of signal scrambling is required to insure that only paid subscribers will receive the product. The use of signal scrambling also requires the use of receiver decoders or descramblers. The potential number of subscribers can be quite large. As a result, it becomes profitable for unauthorized organizations or companies to sell or provide unauthorized decoders or descramblers. For this reason, the scrambling system must be secure, not only against reception by normal televisions, but also against the design of inexpensive pirate receiver decoders or descramblers.

Existing devices are known for encoding and decoding video signals using line-rotation video scrambling. Line-rotation video scrambling intentionally interchanges segments of each video line prior to transmission. At the transmitting end, an encoder must be used accomplish this exchange.

At the transmission end of a conventional line-rotation video scrambling system, horizontal scan lines are cut at varying points and the line segments switched in time. This, in effect, rotates the end of each line to the beginning of the same line. At the reception end, the scrambled video lines are "rotated" back into the original time sequence by the local decoder apparatus.

The known encoder circuitry usable with linerotation scrambling requires the use of two memory circuits with information alternately read out of each. Each of the memory circuits is used to temporarily store a next scrambled line of video while the other memory is reading out a current, unscrambled line of video.

Line-rotation video encoding circuitry is often used in combination with other television transmitter circuitry. Since it is desirable to integrate as many circuits as possible onto a single chip, there exists a need to minimize the complexity of the encoder circuit without impairing its ability to carry out the encoding operation.

SUMMARY OF THE INVENTION

In accordance with the invention, an apparatus and a method are provided for encoding information signals. The encoder apparatus includes an input-output converter unit and a control unit. The encoder apparatus further includes means for storing at least a plurality of data samples for a single digitalized horizontal line of video information received from the converter unit and means for addressing sample storage locations in the storing means. The addressing means are coupled to the control unit. The storing means includes means for reading out a video data sample prestored at a respective addressed storage location to the converter unit and for subsequently writing into the same addressed sample storage location a respective video data sample received from the converter unit. In an embodiment of the invention, the capacity of the storing means in the encoder apparatus is essentially equal to only a single line of video information. In yet another embodiment of the invention, the addressing means is presettable to a predetermined value. The addressing means can further include means for sequentially addressing a plurality of storage locations of the storing means starting from the preset value.

In yet a further embodiment of the invention the addressing means can include an incrementally increasing address counter or an incrementally decreasing address counter with a comparing means which includes a comparator coupled to the address counter. The address counters can be binary counters.

In accordance with the invention, a method is possible of encoding an information signal in an encoder. The encoder has a storage unit and a coupled address register. The method includes the steps of storing a predetermined set of samples of an information signal in the storage unit; determining a split-address and loading the selected split-address into the address register; reading out from the storage unit a sample of encoded information at a location specified by the address in the address register; writing into the same storage location a sample of the information signal to be encoded; comparing the current address in the address register to a predetermined address value and returning to determine a new split-address, (as above), if the current address equals the predetermined end address or changing in a predetermined fashion the address in the address register if not equal and returning to read out from the storage unit (as above).

In a further embodiment of the method, the selected split-address changes in a predetermined fashion for each subsequent information signal. Further, in accordance with the method each information signal can correspond to a video horizontal line signal having a predetermined number of samples. In a further embodiment of the method, the step of changing the address in the address register can include incrementing by one count the address in the address register or alternately decrementing by one count the address in the address register.

In yet another embodiment of the method, wherein the video line signal to be encoded includes N samples per line, and each line is split into at least two segments at a split-address at a transmission site, then an encoder starting address would be determined in accordance with the following formula:

$$\text{Starting Address} = (N - SP + PSA) \text{ modulo } N$$

where N is the number of samples, SP is the split-address and PSA is the previous starting address.

BRIEF DESCRIPTION OF THE DRAWINGS

The invention may be better understood from a reading of the following description in conjunction with the drawings in which.

DETAILED DESCRIPTION

Figure 1:
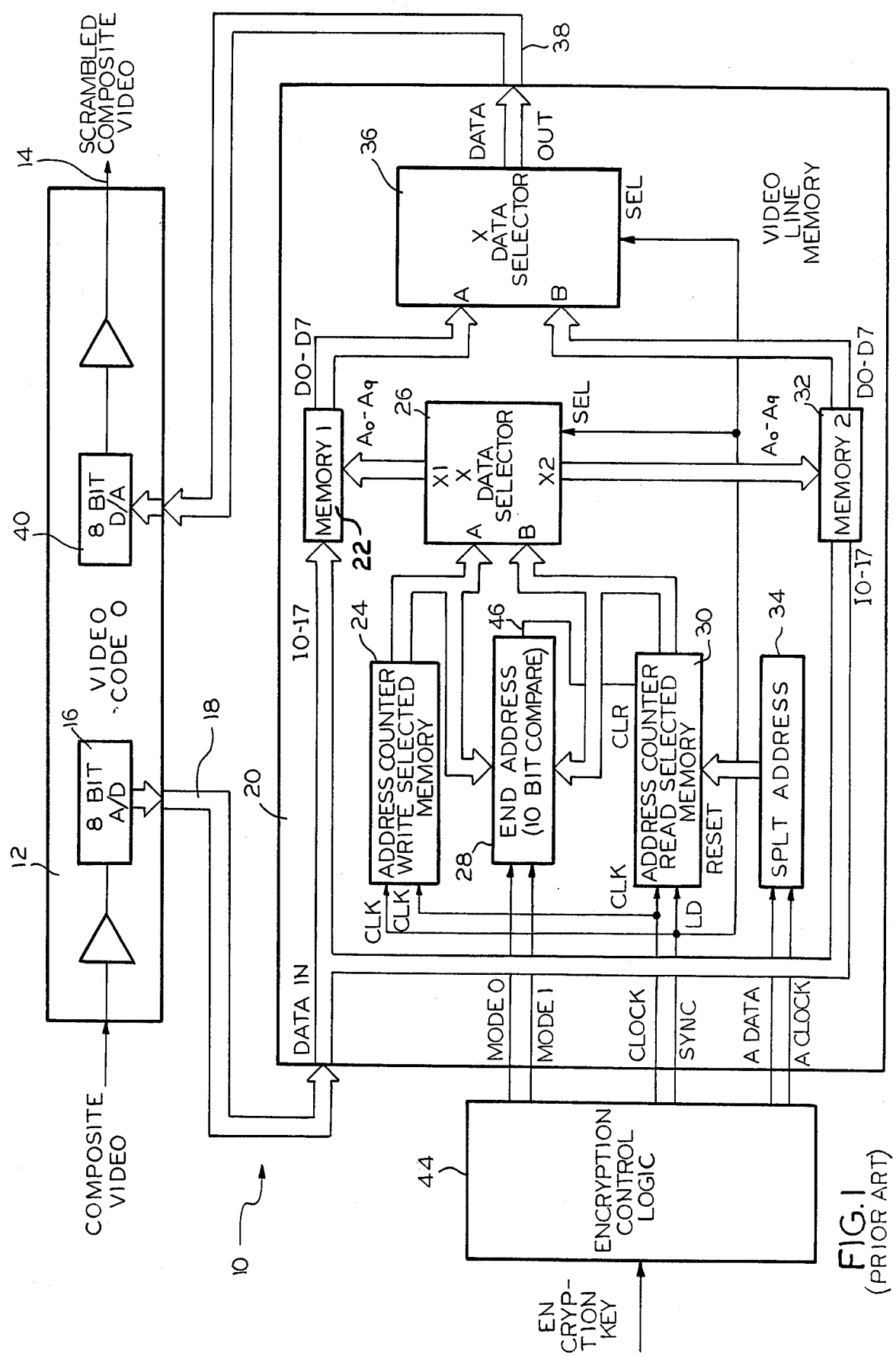
FIG. 1 is a block diagram schematic of a prior art line-rotation encoding apparatus.

With respect to the figures, FIG. 1 illustrates in block diagram form, a prior art line-rotation encoder system 10. The system 10 is usable, for example, in connection with a television receiver. The system 10 includes an input-output conversion unit 12 unit receives input analog composite video signals and provides encoded or scrambled composite video signals on a line 14. At a reception site, not shown, a line-rotation descrambling operation will subsequently be performed on each horizontal line signal in the composite video signal output on the line 14.

The analog composite video signal is first digitized by an analog-to-digital converter (A/D) 16 in the conversion unit 12. The output of the A/D 16, in the form of 8-bit digital samples, is transmitted via an 8-bit data bus 18 to a encoder unit 20.

The function of the encoder unit 20 is to perform the line-rotation scrambling operation which will be reversed at the reception site. The unit 20 includes a read-write memory 22. The memory 22 includes a plurality of locations for storing 8-bit video data samples received from the bus 18. The capacity of the memory 22 is large enough to store a set of digital samples from the bus 18 corresponding to all or part of a single horizontal video line. The read-write memory 22 may be a random access memory. The implementation of the memory 22 is conventional in the art.

Video samples are stored in locations in the memory 22 under the control of a write select address counter 24. The write select counter 24 could be, for example, a 10-bit binary counter. Outputs from the write select counter 24 are coupled by a selector circuit 26 to a 10-bit address input of the memory 22. The selector circuit 26 could, for example, be a conventional multiplexor. Outputs from the write counter 24 are also coupled to a 10-bit comparator 28. A read select address counter 30 is also coupled to the data selector 26 and the comparator 28.

At the same time as the memory 22 is being loaded with sampled video horizontal line data from the bus 18, samples corresponding to a previous line of video data are being read-out from a second memory 32. Ten bit address signals are supplied to the memory 32 by the read-address counter 30 via the data selector 26. The memory 32 has the same storage capacity as does the memory 22 and may be implemented in the same manner as the memory 22.

The counter 30 has been preloaded with the address of the split point of the unscrambled video line by split-address circuitry 34. The split-address circuitry 34 could be implemented, for example, as a combinational circuit alone or as a combinational circuit combined with a storage register. The implementation of the split-address circuitry is conventional in the art.

From this "split-address", the counter 30 is incremented to its highest address, overflows to zero, and continues incrementing to a value of "split-address-minus-1". At this time the entire previous line has been read-out from the memory 32. A second data selector, or multiplexor, 36 couples the output signals from the memory 32 to a data out bus 38. The bus 38 is in turn electrically connected to an 8-bit digital to analog converter (D/A) 40. The D/A 40 generates an encoded analog composite video signal on an output line 14 for use by a television transmitter. Conventional control logic 44 provides timing and control signals to the system 10.

As is conventional in the art, the comparator 28 generates an ouput signal or indicia on a line 46 indicating when a predetermined end address has been reached by the read select counter 30. The signal on the line 46 can be used to clear the counter 30. Bits or stages of the counter 30 can then be set by the split-address circuitry 34 to a new split-address value for the next line of video information.

The encoding process is now repeated with the functions of the memories 22 and 32 being interchanged by means of the data selectors 26 and 36. The memory 32 will now be loaded with video data samples from the bus 18 for the next line of video under control of the write address counter 24. The memory 22 will simultaneously read-out to the selector 36 and the output bus 38, the encoded video samples for the current horizontal line under control of the read address counter 30.

The system 10 requires memories 22 and 32 for storage of data for the active portion of two video lines, address counters 24 and 30 for each respective memory 22 and 33, and two selectors or multiplexors 26 and 34. For most applications the horizontal blanking interval need not be stored in the memories 22 or 32.

Figure 2:
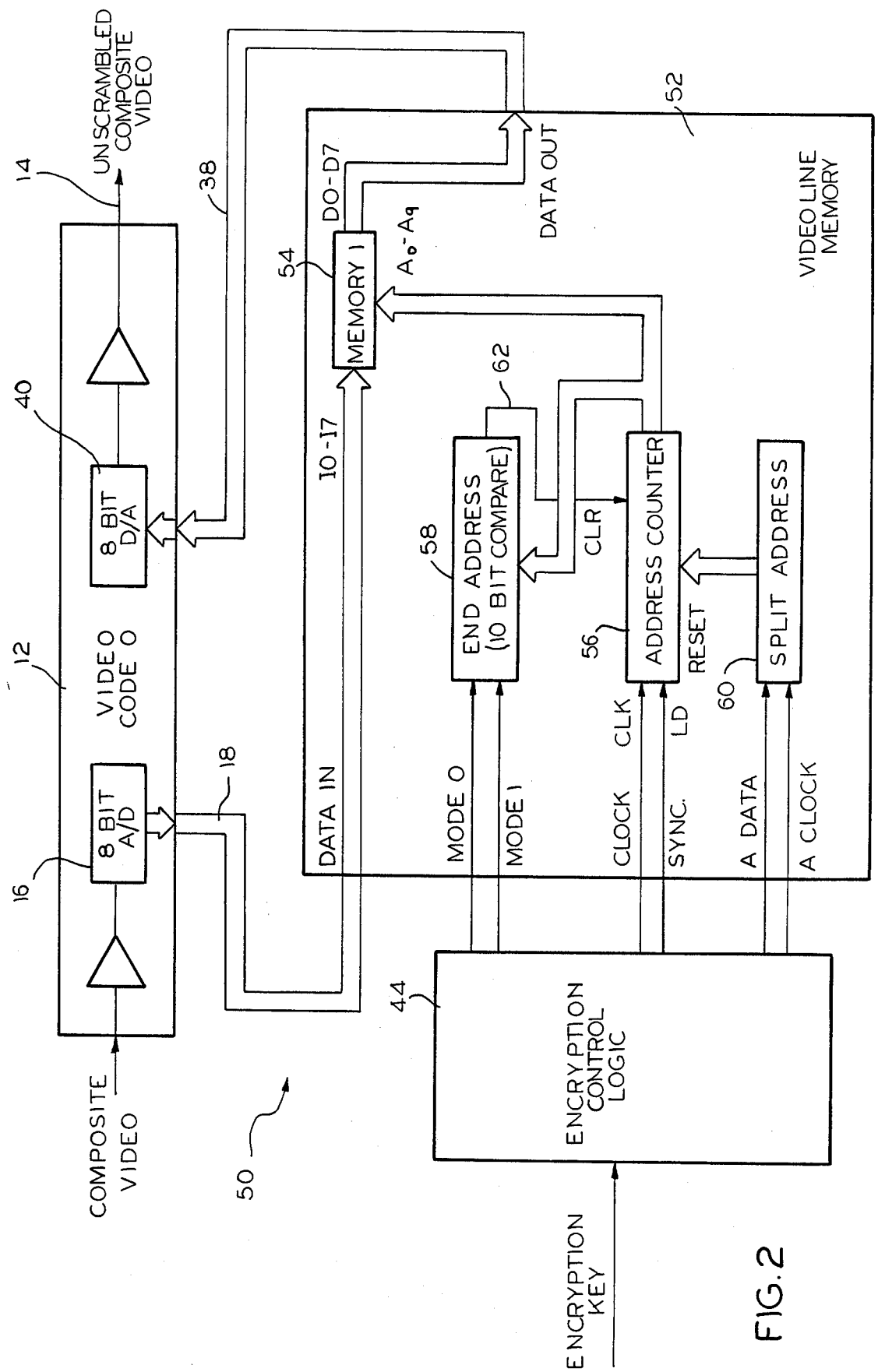
FIG. 2 is a block diagram schematic of a line rotation encoding apparatus in accordance with the present invention.

FIG. 2 illustrates a system 50 in accordance with the present invention. The system 50 includes the same converter unit 12 and control logic 44 disclosed above and illustrated in FIG. 1. The system 50 also includes an encoder unit 52 in accordance with the present invention.

An important advantage of the encoder unit 52 is that the unit 52 uses the identical converter unit 12 as does the prior art encoder unit 20 of FIG. 1 and has the same input-output configuration as does the system 10. However, the encoder 52 requires only one-half the storage capacity and fewer control circuits than does the encoder 20.

The encoder 52 includes a memory 54 with each sample storage location capable of storing 8-bit samples received off of the input bus 18. The memory 54 is large enough to store a single, digital, horizontal line of video information. Each of the memories 22 and 32 has the same capacity as does the memory 54. The memory 54 also may be implemented as a random access memory. The exact implementation of the memory 54 is not a limitation of the present invention.

Address signals are provided to the memory 54 by a 10-bit address counter 56. The address counter 56 is also coupled to a 10-bit end address comparator 58. Split-address circuit 60 provides an initial split-address for the address counter 56. The address counter 56 could be implemented, for example, as a binary up-counter or alternately as a binary down-counter.

Before the beginning of an active portion of a horizontal line of video information on the bus 18, the address counter 56 is loaded with the split-address of the previous line of video information already stored in the memory 54. The previously stored data sample of video information is then read out of the location in the memory 54 addressed by the counter 56. Immediately thereafter, the contents of this storage location are overwritten by a new data sample, corresponding to a current line of video information on the bus 18. The counter 56 is then pulsed to form a new address. As each prestored sample is output to the bus 38 from an addressed location in the memory 54, that location is immediately overwritten by a new sample of video information from the bus 18. If the counter 56 is an upcounter, it sequentially is incremented to an end address. The counter 56 then clears to zero and continues to increment to a value of split-address-minus-1.

At this point the entire previous line of video information has been output in time exchanged (or transposed) form to the bus 38. In addition, during this same time period, the next line of video information has been stored in a single line memory 54. The exact details of reading out a first data sample and overwriting that location immediately with a subsequent data sample are, in general, conventional in the art. Specific details readily can be provided by one of skill in the art.

An output signal on a line 62 from the comparator 58 clears the address counter 56 when a predetermined end address value has been reached. The input to the comparator 58 can be obtained from the previous end address value sensed for the counter 56 and then used during the next line encoding operation. The subsequent lines are rotated in the same manner, without need of the second address counter 30, the second memory 32 or multiplexors.

There exists an important operational difference between the encoder 52 and the encoder 20. The start-address value in the decoder at the receive site for a new line in the encoder 52 will be rotated along with the time correcting of the previous line. It is known with respect to the encoder 20 that the relation between the split-address at the encryption end and the start-address at the decryption end is given by the formula:

$$ST = N - SP$$

where N is the number of samples per horizontal line of video, ST is the start-address (0 to N−1), and SP is the split-address.

In the converter 52, the relation becomes:

$$ST = (N - SP + PSA) \text{ modulo } N$$

where PSA is the start-address used to decrypt the previous line. Thus, one additional sum and modulo operation must be performed in connection with the counter 56. However, it is done only at the horizontal line rate and can be included in the encryption control logic of the encoder as, for most applications, there will be many receivers for each transmitter.

As an alternate embodiment, encryption could be hardened further by adding a decriment capability to the address counter 56. In this way the line segments could be transmitted in reverse time as well as interchanged. The segments could be independently selected for normal or reverse time.

Because of the substantial reduction in the circuitry of the encoder 52, all of the necessary functions could be integrated onto a chip along with other control circuitry that could include, for example, a microprocessor type control unit.

While a specific embodiment has been disclosed herein, it will be understood that the broader aspects of the invention include those alternate forms of circuits or counters as would be known to those of skill in the art.

What is claimed is:

1. In a video encoder apparatus having an input-output converter unit and a control unit, an improvement comprising:
   means for storing a first plurality of digital data samples of video information received from said converter unit, said storing means having a capacity for storing digital data samples for essentially only a single line of video information;
   split-address means for determining a split-address; and
   means for addressing unique sample storage locations in said storing means, coupled to said control unit, with said storing means including means for reading out a digital data sample from the first plurality prestored at a respective addressed storage location to said converter unit and for writing into said same addressed sample storage location a respective digital data sample from a second plurality received from said converter unit
   said addressing means being presettable to said split-address and including means for sequentially addressing a plurality of storage locations of said storing means starting from said split-address.

2. An encoder apparatus as defined in claim 1 including:
   means for comparing the current address value generated by said addressing means to a predetermined end address value and for causing said split-address means to determine a new split-address when said current address value is the same as said predetermined end address value.

3. An encoder apparatus as defined in claim 2 wherein said reading and writing means include means for overwriting said same addressed location immediately after reading said location.

4. An encoder apparatus as defined in claim 2 wherein said addressing means include an incrementally increasing address counter.

5. An encoder apparatus as defined in claim 2 wherein said addressing means include an incrementally decreasing address counter.

6. An encoder apparatus as defined in claim 4 wherein said comparing means include a comparator coupled to said address counter.

7. A method of encoding a plurality of information signals in an encoder having a storage unit and a coupled address register comprising the steps of:
   (A) storing a predetermined set of digital samples of an information signal corresponding essentially to a single video line in the storage unit;
   (B) determining a split-address and loading said split-address into the address register;
   (C) reading out from the storage unit a digital sample of encoded information at a location specified by the address in the address register;
   (D) writing into said same location a digital sample of information for a subsequent information signal;
   (E) comparing the current address in the address register to a predetermined end address value and if the same returning to step (B) above, otherwise,
   (F) changing the address in the address register by one count and then returning to step (C) above.

8. A method of encoding as defined in claim 7 wherein the split-address determined in step (B) changes in a predetermined fashion for each information signal.

9. A method of encoding as defined in claim 8 wherein changing the address in the address register in step (D) above includes incrementing by one count the address in the address register.

10. A method of encoding as defined in claim 8 wherein changing the address in the address register in step (D) above includes decrementing by one count the address in the address register.

11. A method of encoding as defined in claim 6 wherein each video line signal includes N digital samples per line, each said line is split into at least two segments at a predetermined split-address in a transmission site and the starting address of step (B) is determined in accordance with the formula:

Starting Address $= (N - SP + PSA)$ modulo N where N is a number of digital samples, SP is the split-address and PSA is the previous starting address.

* * * * *